United States Patent [19]
Shoda

[11] Patent Number: 5,689,140
[45] Date of Patent: Nov. 18, 1997

[54] METHOD FOR FORMING STUDS AND INTERCONNECTS IN A MULTI-LAYERED SEMICONDUCTOR DEVICE

[75] Inventor: Naohiro Shoda, Wappingers Falls, N.Y.

[73] Assignee: Kabushiki Kaisha Toshiba, Kawasaki, Japan

[21] Appl. No.: 768,394

[22] Filed: Dec. 18, 1996

Related U.S. Application Data

[60] Continuation of Ser. No. 429,148, Apr. 26, 1995, abandoned, which is a division of Ser. No. 321,896, Oct. 14, 1994, Pat. No. 5,529,953.

[51] Int. Cl.$^6$ .................. H01L 23/48; H01L 23/52; H01L 29/40
[52] U.S. Cl. .................. 257/774; 257/751; 257/725
[58] Field of Search .................. 257/774, 377, 257/751, 752, 754

[56] References Cited

U.S. PATENT DOCUMENTS

| | | | |
|---|---|---|---|
| 4,789,648 | 12/1988 | Chow et al. | 437/225 |
| 4,837,051 | 6/1989 | Farb et al. | 427/97 |
| 4,920,070 | 4/1990 | Mukai | 437/173 |
| 4,987,099 | 1/1991 | Flanner | 437/192 |
| 5,026,666 | 6/1991 | Hills et al. | 437/195 |
| 5,093,279 | 3/1992 | Andreshak et al. | 437/173 |
| 5,198,389 | 3/1993 | Van der Putten et al. | 437/190 |
| 5,204,286 | 4/1993 | Doan | 437/195 |
| 5,262,354 | 11/1993 | Cote et al. | 437/195 |
| 5,266,446 | 11/1993 | Chang et al. | 430/314 |
| 5,312,777 | 5/1994 | Cronin et al. | 437/195 |
| 5,348,485 | 9/1994 | Nishida et al. | 257/751 |

*Primary Examiner*—Stephen Meier
*Attorney, Agent, or Firm*—Banner & Witcoff, Ltd.

[57] ABSTRACT

A method of manufacturing a semiconductor device having a stud and interconnect in a dual damascene structure uses selective deposition. The method includes forming a trench including a first opening portion and a second opening portion in a dielectric layer, forming a first adhesion layer on a surface exposed by the first opening portion, forming a second adhesion layer on a surface exposed by the second opening portion, and selectively depositing a conductive material on the first adhesion layer and the second adhesion layer, wherein growth of the conductive material on the second adhesion layer starts after growth of the conductive material on the first adhesion layer has started. The first and second adhesion layers are of different materials.

14 Claims, 6 Drawing Sheets

METHOD FOR FORMING STUDS AND INTERCONNECTS IN A MULTI-LAYERED SEMICONDUCTOR DEVICE

This application is a continuation of application Ser. No. 08/429,148 filed Apr. 26, 1995, now abandoned; which is a division of Ser. No. 08/321,896, filed Oct. 14, 1994 now U.S. Pat. No. 5,529,953.

FIELD OF INVENTION

The invention generally relates to a method of manufacturing semiconductor devices and, more particularly, to a method of forming studs and interconnects in a multi-layered semiconductor device.

BACKGROUND OF INVENTION

Semiconductor devices typically include a plurality of circuits forming an integrated circuit. In an integrated circuit, the devices and elements formed in a semiconductor substrate are interconnected with metal leads (i.e., metal lines or interconnects) which are typically formed by sequential deposition, masking, and etching, generally referred to as metallization. Metallization starts in the masking area where small openings or windows, called vias or contacts, are etched through all the surface layers, down to the active regions of the devices. Following contact masking, a thin layer of conductive material is deposited by, for example, vacuum evaporation, sputtering, or chemical vapor deposition (CVD) techniques, over the entire wafer. The unwanted portions of this layer are removed by Chemical Mechanical Polishing (CMP). This step leaves the surface covered with thin lines of metals, that is interconnects.

The aforementioned process is described with reference to a single damascene structure (a single-level or single-layered metal structure). Increasing chip density has placed more components on the wafer surface which in turn has decreased the area available for surface wiring. Multi-level or multi-layered schemes such as dual damascene structures have become desirable to increase chip density. Typically, multi-level schemes start with a standard metallization process which leaves the surface components partially wired together. Next a layer of dielectric material such as an oxide, silicon nitride, or polyimide is deposited thereon. The dielectric layer undergoes a masking step that etches contacts or vias down to a first level metal.

Metal has been employed to interconnect the electrical contacts formed between an overlying conductive region and an underlying region through a layer of dielectric material. Typically, the overlying layer is metal and the underlying layer may be a doped semiconductor region, salicide, or another metal layer. The contact between the two layers is through the conductive filled windows or openings, the contacts and vias described above. Contacts refer to an interconnect which interconnects a source-drain region, salicide or polysilicon to metal while vias refer to an interconnect which connects metal to metal.

Multi-level metal systems are more costly, of lower yield, and require greater attention to planarization of the wafer surface and intermediate layers to create good current-carrying leads. Thus, it is important to reduce the processing steps required to form multi-level structures.

According to prior art methods such as described in U.S. Pat. No. 4,789,648 to Chow et al. which is incorporated herein by reference, conductive material is deposited on a surface including an interconnect groove and inside the opening of the contact simultaneously. In particular, the Chow et al. patent discloses a method for forming interconnects on a single conductive layer including vias and wiring channels, referred to as interconnect grooves in a multi-layered system utilizing a blanket CVD technique. This is done to minimize the number of steps required to form the desired structure. However, there are several problems associated with these types of prior art techniques. For example, the conductive material often overhangs at the edge of the opening of the contact which creates voids or seams within the conductive material in the opening of the contact. More specifically, voids and seams typically result when growth of the conductive material in the interconnect grooves and on sidewalls of the contact or via holes occurs before growth of the conductive material at the bottom of the contact or via hole has been completed. The presence of seams and voids adversely affects the processing yield.

A method for selectively filling contacts or vias with CVD tungsten is known in the art as described in U.S. Pat. No. 4,987,099 to Flanner which is incorporated herein by reference. Selective CVD can be used in order to minimize processing steps such as additional etching and polishing required to remove excess conductive material deposited when using blanket CVD. However, when selective CVD as described in Flanner is used, the coverage of the conductive material may be incomplete causing voids and seams to appear in the contact. As noted, processing yield is negatively impacted by the presence of seams and voids.

SUMMARY OF THE INVENTION

The present invention overcomes the disadvantages associated with the prior art methods of forming interconnects in multi-layer semiconductor devices. For example, the present invention reduces the possibility of open and short circuits thereby increasing the yields of interconnection when a multi-level or multi-layered scheme such as a dual damascene structure is used. Further, the stability of the manufacturing process and the performance and reliability of the semiconductor device are enhanced. For instance, seams and voids which are often present in interconnects formed in accordance with the prior art methods are substantially eliminated.

According to the present invention, studs and interconnects can be formed in a multi-level or multi-layered scheme such as a dual damascene structure while minimizing the potential for voids and seams in the structure. Voids and seams typically result when growth of the conductive layer in the interconnect grooves and on sidewalls of the contact or via holes occurs before growth at the bottom of the contact or via hole has been completed. Consequently, overhanging at the corner of the hole and/or poor coverage of selective conductive layer deposition results which in turn creates seams and voids.

The present invention overcomes the aforementioned problem by using separate adhesion layers for the bottom of the contact or via hole and the interconnect groove. The first adhesion layer deposited at the bottom of the hole to be filled is selected such that during selective deposition of the conductive layer such as by chemical vapor deposition, the incubation time for growth on the first adhesion layer is less than the incubation time for growth of the conductive layer on the second adhesion layer. More particularly, the adhesion layers are selected so that growth of the conductive layer in the hole finishes before growth on the interconnect groove begins. The temperature during the selective CVD process controls the incubation time and growth rate. After growth of the conductive layer in the hole finishes, the temperature increases and the growth of the conductive layer on the second adhesion layer begins.

A method of manufacturing a semiconductor device on a substrate according to the present invention includes the steps of forming a dielectric layer on a substrate, forming a trench including first and second opening portions in the dielectric layer, forming a first layer on a surface exposed by the first opening portion, and forming a second layer on a surface exposed by the second opening portion, the second layer being of a different material than the first adhesion layer. A conductive material is selectively deposited on the first layer and the second layer, wherein growth of the conductive material on the second layer starts after growth of the conductive material on the first layer has started.

BRIEF DESCRIPTION OF THE DRAWINGS

The present invention will now be described in more detail with reference to preferred embodiments of the invention, given only by way of example, and illustrated in the accompanying drawings in which.

DETAILED DESCRIPTION

The present invention is discussed below with reference to a process for filling a trench in a dielectric material with a conductive material such as tungsten in order to provide an electrical contact to an underlying region, wherein the trench in the dielectric material has a dual damascene structure. However, the invention is not limited in this respect and it will be apparent that the teachings of the present invention may be applied, for example, to filling trenches having a dual damascene structure with other materials such as dielectric materials and to filling trenches having structures other than a dual damascene structure. It should be understood that the term trench encompasses any opening which may be formed in at least one layer of material.

Figure 1A:
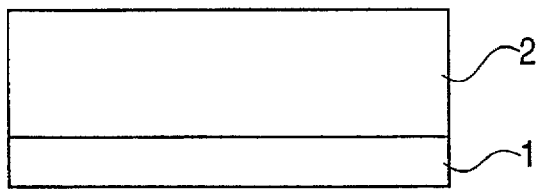
FIGS. 1a–e illustrate the result of the various steps according to an exemplary embodiment of the method of the present invention.
Figure 1B:
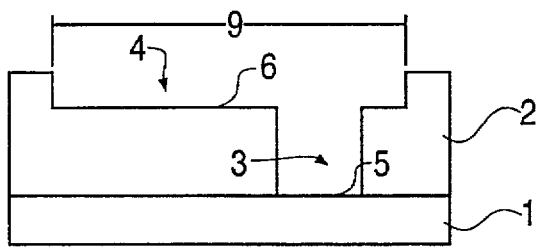
Figure 1C:
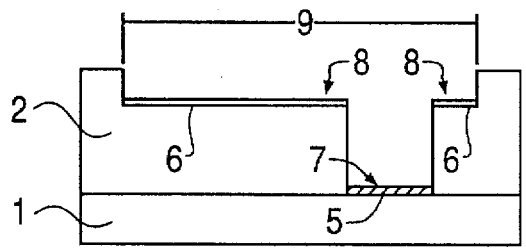

A process for filling a trench having a dual damascene structure with a conductive material will be generally discussed with reference to FIGS. 1a–e. With reference to FIG. 1a, a dielectric film 2 such as silicon dioxide (SiO$_2$) is formed on a semiconductor substrate 1 of a semiconductor device. By way of example, but not by way of limitation, the semiconductor device may be a semiconductor memory device such as a dynamic random access memory (DRAM). Dielectric layer 2 is then etched using, for example RIE (reactive ion etching), to form a trench 9 having a dual damascene structure as shown in FIG. 1b. Trench 9 includes a first opening portion 4 which is hereinafter referred to as an interconnect groove and a second opening portion 3 which is hereinafter referred to as a contact hole. Interconnect groove 4 includes a bottom groove portion defined by an exposed surface portion 6 of dielectric film 2 and contact hole 3 includes a bottom groove portion defined by an exposed surface portion 5 of semiconductor substrate 1. Next, a first conductive layer 7 is formed on surface portion 5 of semiconductor substrate i and a second conductive layer 8 is formed on surface portion 6 of dielectric film 2 as shown in FIG. 1c. Conductive layers 7 and 8 may be formed, for example, by respective selective chemical vapor depositions (CVDs).

Figure 2:
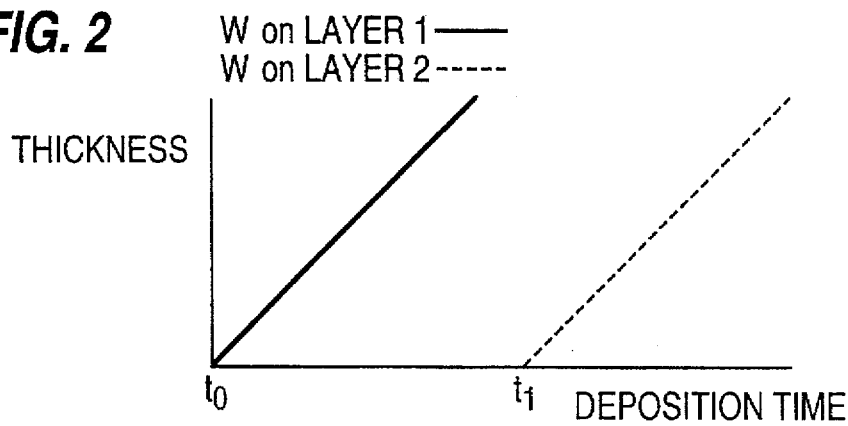
FIG. 2 graphically illustrates the relationship between the growth of the conductive layer on the first and second adhesion layers according to the present invention.

The necessity and selection of materials for conductive layers 7 and 8 is determined in accordance with the material which is used to fill trench 9. As will be explained in greater detail below, since tungsten is used in the instant embodiment to fill trench 9, the materials for forming conductive layers 7 and 8 are selected such that the incubation time for depositing tungsten on conductive layer 7 is shorter than the incubation time for depositing tungsten on conductive layer 8. For example, the layer 7 may be a salicide, silicide, silicon, or metal and the layer 8 may for example, be a metal, metal nitride, or metal boride. FIG. 2 is a graph plotting deposition time versus thickness for tungsten on conductive layers 7 and 8. As can be seen, deposition of tungsten on conductive layer 7 begins at a time $t_0$ and deposition of tungsten on conductive layer 8 begins at a time $t_1$ which is later than time $t_0$.

Figure 1D:
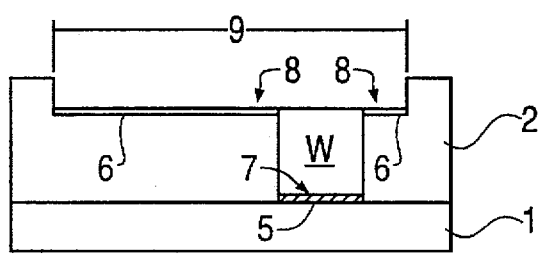
Figure 1E:
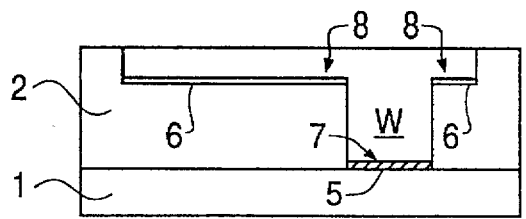
Figure 7:
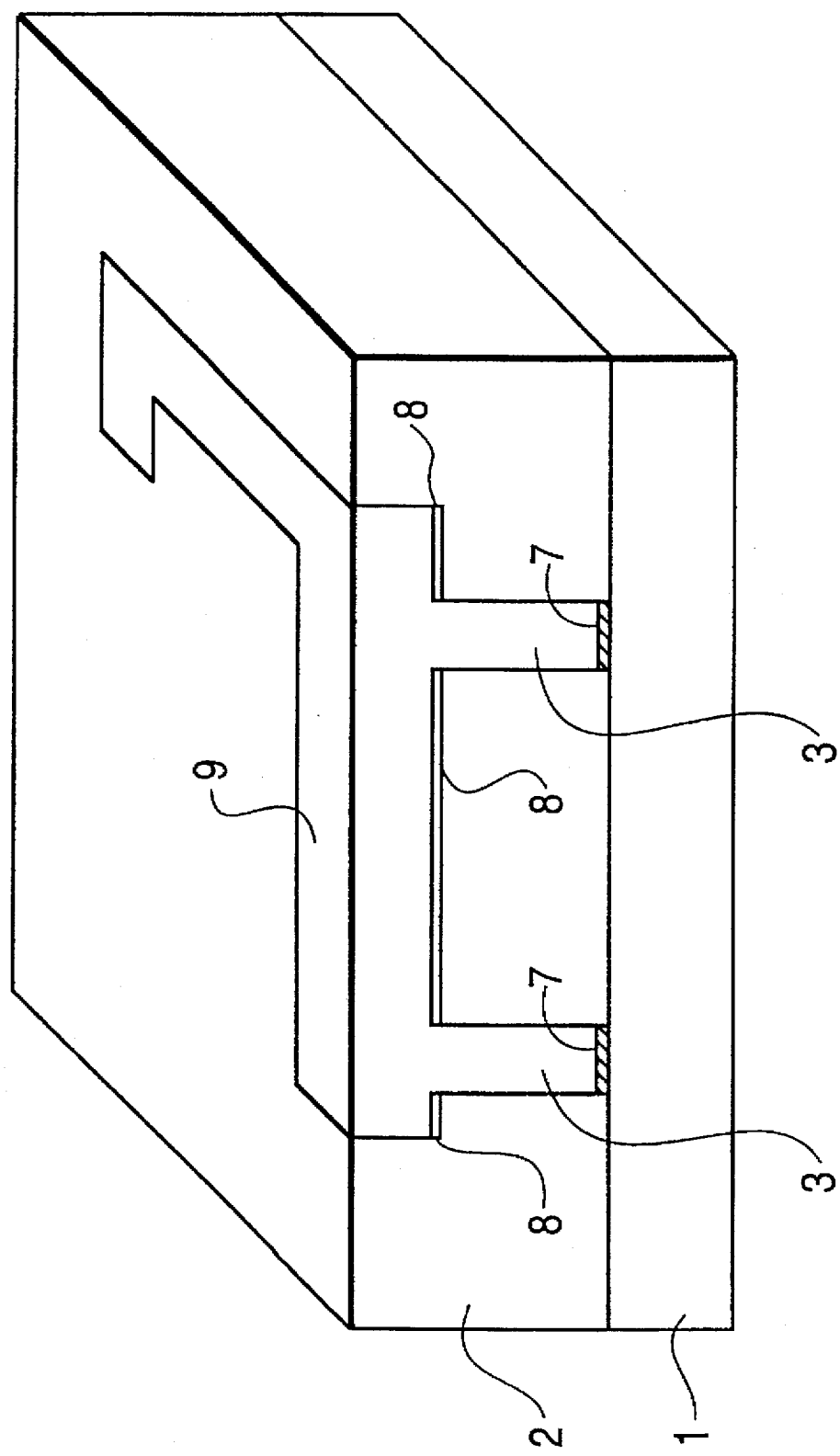
FIG. 7 illustrates a three-dimensional representation of a dual damascene structure according to the present invention.

With reference to FIG. 1d, a tungsten layer portion W is deposited by, for example, selective chemical vapor deposition on conductive layer 7 to fill in contact hole 3. Due to the above-described difference in incubation times of tungsten on conductive layers 7 and 8, no tungsten is deposited on conductive layer 8 during the filling of contact hole 3 as shown in FIG. 1d. After contact hole 3 has been filled, a tungsten layer portion W is deposited by, for example, chemical vapor deposition on conductive layer 8 to fill in interconnect groove 4 as shown in FIG. 1e. A three dimensional representation of a dual damascene structure such as that of FIG. 1e is shown in FIG. 7. In accordance with the above-described method, a trench having a dual damascene structure including a contact hole and an interconnect groove can be filled with tungsten without the creation of voids which can occur if tungsten deposition occurs simultaneously in the contact hole and the interconnect groove of the trench. Thus, an improved electrical contact can be formed.

Deposition conditions such as temperature and pressure may be used to control the incubation time of tungsten on conductive layers 7 and 8. For example, under a deposition condition at a first temperature T1, tungsten is deposited on conductive layer 7, but not on conductive layer 8. When contact hole 3 has been filled, the deposition condition may be changed to a second temperature T2 at which tungsten is deposited on conductive layer 8.

Also, surface pretreatments such as RIE, chemical dry etching, wet etching, or a combination thereof can be performed on the conductive layer 8 prior to depositing tungsten thereon if needed. Surface pretreatments can reduce the incubation time for tungsten growth to begin on the conductive layer 8. After the tungsten has been deposited on the conductive layer 8, the surface can also be planarized if necessary.

Although the method described with respect to FIGS. 1a–e is described with reference to filling a trench for forming a contact with a surface portion of a semiconductor substrate, the invention is generally applicable where it is desired to fill a trench in one or more layers disposed on an underlying layer. Further, it will be apparent that the invention is not limited to filling a contact with a conductive material, but may also be applied to filling a trench with a dielectric material. In addition, conductive layers 7 and 8 are provided since the fill material is tungsten and tungsten may only be deposited by selective chemical vapor deposition on a conductive material. If the fill material does not require such layers in order to be deposited and if the incubation time for the fill material on surface portion 5 of semiconductor substrate 1 is different than the incubation time for the fill material on surface portion 6 of dielectric layer 2, layers corresponding to conductive layers 7 and 8 are not required.

Specific examples of the aforementioned process will be described below.

EXAMPLE 1

Figure 3A:
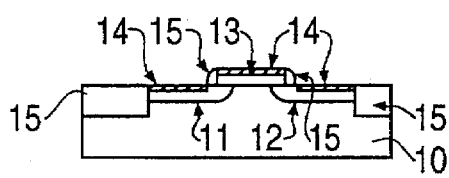
FIGS. 3a–g illustrate an exemplary embodiment of the application of the method of the present invention to filling a contact hole in a MOS device.
Figure 3D:
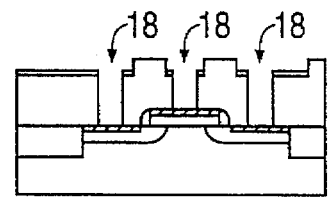

Referring to FIGS. 3a–g, the application of the aforementioned process to contact hole filling of a MOS device is described. A MOS device is formed on a substrate 10, e.g., silicon, in a manner known in the art. As shown in FIG. 3a, the MOS device includes a source 11, a drain 12, and a gate electrode 13 with a first adhesion layer 14 thereon, preferably a salicide such as $TiSi_2$. A sidewall dielectric 15 such as $SiO_2$ is formed on the sidewalls of gate electrode 13.

Figure 3B:
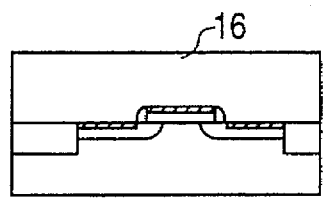

A dielectric layer 16 is deposited on the MOS device as shown in FIG. 3b. Interconnect grooves and a second adhesion layer 17 on the interconnect grooves are formed by the lift off technique. Preferably, the second adhesion layer is titanium nitride (TIN).

Figure 3E:
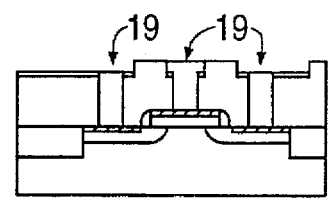
Figure 3C:
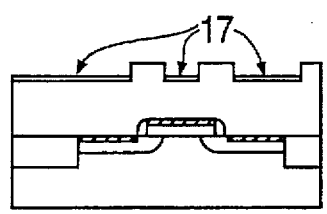

According to the lift-off technique, a photoresist is deposited on top of the dielectric layer 16. Next, the photoresist is exposed and developed to form interconnect grooves. Thereafter, metal is deposited by vapor deposition over the photoresist and in the interconnect grooves. The photoresist is "lifted off" along with the unwanted metal sitting on top of the photoresist, leaving the metal second adhesion layer 17 on the interconnect grooves as depicted in FIG. 3c.

Next, a resist is patterned for contact holes. The second adhesion layer 17 and the dielectric layer 16 are etched sequentially and the resist is removed leaving the structure shown in FIG. 3d with the contact holes 18 exposing the first adhesion layer 14 on the source 11, the drain 12, and the gate electrode 13.

Next, a layer of conductive material 19, for example tungsten, is selectively deposited on the first and second adhesion layers 14 and 17. The contact holes 18 are filled with the conductive material 19 before growth begins on the second adhesion layer 17 as shown in FIG. 3e. As the temperature of the substrate 10 increases during the deposition process, the conductive layer 19 forms on the second adhesion layer 17 leaving the structure depicted in FIG. 3f. More specifically, with the first adhesion layer 14 being $TiSi_2$ and the second adhesion layer 17 being TiN, the temperature is raised to approximately 250° C. Above this temperature, tungsten growth occurs within a reasonable incubation time on $TiSi_2$. A reasonable incubation time for growth of a conductive layer is on the order of 10 seconds. Tungsten begins to grow on TiN at temperatures in excess of 300° C. in a reasonable time. Thus, once the contact holes 18 are filled at 250° C., the temperature is raised above 300° C., for example to 350° C., for tungsten growth on TiN to occur within a reasonable incubation time.

Alternatively, by pretreating the surface following deposition on the first adhesion layer, incubation time for growth to begin on the TiN can be reduced. For example, if the first adhesion layer is pretreated, the temperature required for growth of tungsten to occur within a reasonable time decreases. Thus, if tungsten growth occurs in a reasonable time at 300° without pretreating, after pretreating tungsten growth will occur within a reasonable time at a lesser temperature. Pretreatment techniques include RIE, chemical dry etching, wet etching, or a combination thereof.

Figure 3F:
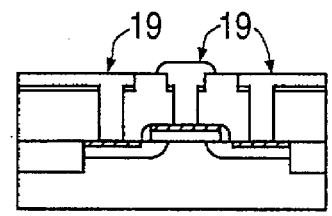
Figure 3G:
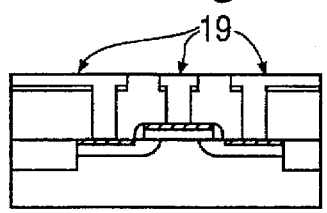

If the MOS device has contact holes 18 of different depths, then the conductive layer 19 will be non-planar as shown in FIG. 3f. Accordingly, the conductive layer 19 is planarized using a technique such as CMP leaving the structure of FIG. 3g.

EXAMPLE 2

Referring to FIGS. 4a–e, another application of the aforementioned process to contact hole filling of a MOS device is described. The MOS device has the same elements as those depicted in FIG. 3a of example 1.

Figure 4A:
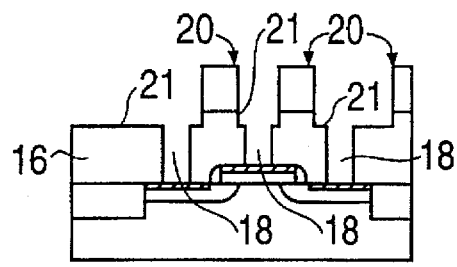
FIGS. 4a–e illustrate another embodiment of the application of the method of the present invention to filling a contact hole in a MOS device.
Figure 4B:
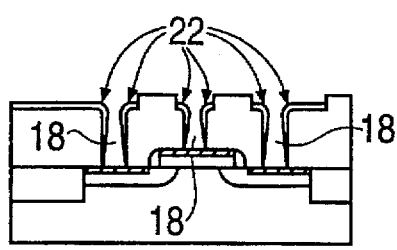

A dielectric layer 16 is deposited on the MOS device. Then a resist 20 is deposited thereon. The contact holes 18 and interconnect grooves 21 are etched using the resist 20 as a mask leaving the structure depicted in FIG. 4a. Next, an adhesion layer of non-coherent TiN 22 is sputtered over the structure and the resist 20 is removed, including the TiN deposited thereon leaving the structure in FIG. 4b. Non-coherent TiN has poor coverage and, consequently, no TiN film 22 forms at the bottom of the contact holes 18 as shown in FIG. 4b. However, in this example TiN 22 forms on the sidewalls of the contact holes 18.

Figure 4C:
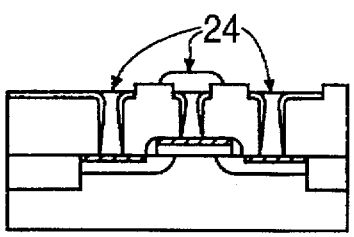

Thereafter, tungsten layer 24 is selectively deposited in the contact holes 18 and on the TiN layer 22 wherein tungsten layer 24 grows only from the bottom of the contact holes 18 as depicted in FIG. 4c. Selective deposition in the contact holes 18 occurs at approximately 250° C. Once the contact holes 18 are filled, $Cl_2$ RIE is applied to remove surface $TiO_2$ or $TiO_xN_y$ (i.e., titanium oxynitride) and tungsten is deposited on TiN layer 22 in the interconnect grooves 21 resulting in the structure of FIG. 4d. Thus, the pretreatment techniques can be used following the filling of the contact holes 18 to provide an environment in which growth of tungsten occurs on the TiN layer 22 in a reasonable incubation time without increasing the temperature.

Figure 4D:
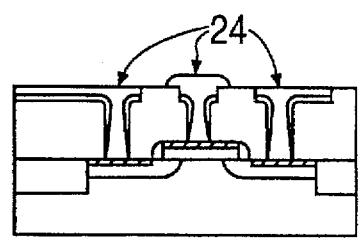
Figure 4E:
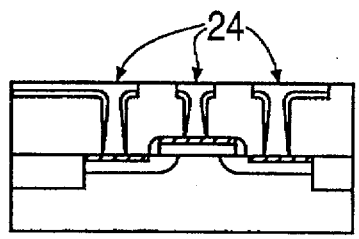

Alternatively, the substrate temperature can be increased to a temperature at which tungsten layer 24 grows on the TiN layer 22 in a reasonable incubation time leaving the structure shown in FIG. 4d. Also, pretreatment can be performed prior to increasing the temperature. Following planarization, the structure depicted in FIG. 4e remains.

EXAMPLE 3

Referring to FIGS. 5a–g, this example relates to yet another application of the aforementioned process to contact hole filling of a MOS device. The MOS device has the same elements as those depicted in FIG. 3a of example 1.

Figure 5A:
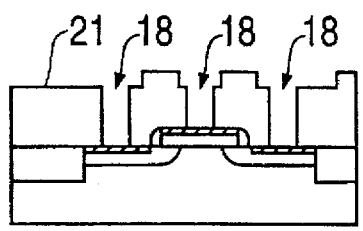
FIGS. 5a–g illustrate yet another embodiment of the application of the method of the present invention to filling a contact hole in a MOS device.
Figure 5B:
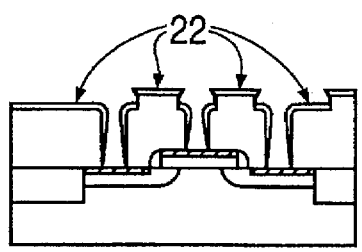
Figure 5C:
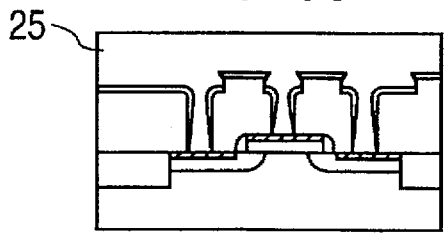
Figure 5D:
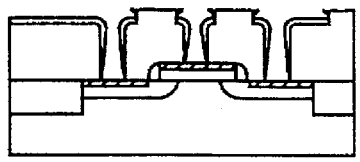

After contact holes 18 and interconnect grooves 21 are formed as described in example 2, the resist is removed leaving the structure shown in FIG. 5a. Next, non-coherent TiN 22 is sputtered on the structure leaving the structure in FIG. 5b. A resist 25 is spread on the exposed surface as shown in FIG. 5c. The TiN layer 22 and resist 25 are polished and then the resist 25 is removed leaving the structure shown in FIG. 5d.

Figure 5E:
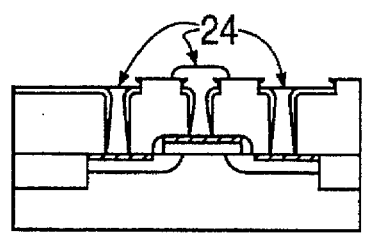
Figure 5F:
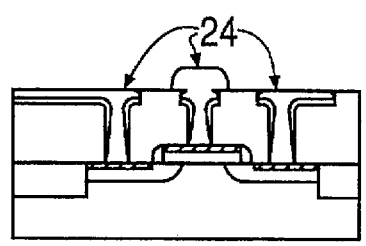
Figure 5G:
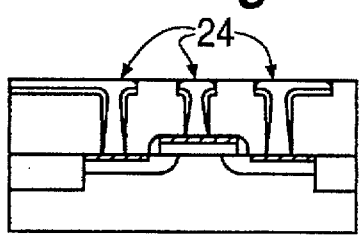

Thereafter, tungsten layer 24 is selectively deposited in the contact holes 18 and on the TiN layer 22 wherein tungsten layer 24 grows only from the bottom of the contact holes 18 as depicted in FIG. 5e. Subsequently, as the deposition conditions change and the substrate temperature rises, tungsten layer 24 grows on the TiN layer 22 leaving the structure shown in FIG. 5f. Following planarization, the structure depicted in FIG. 5g remains.

EXAMPLE 4

Figure 6A:
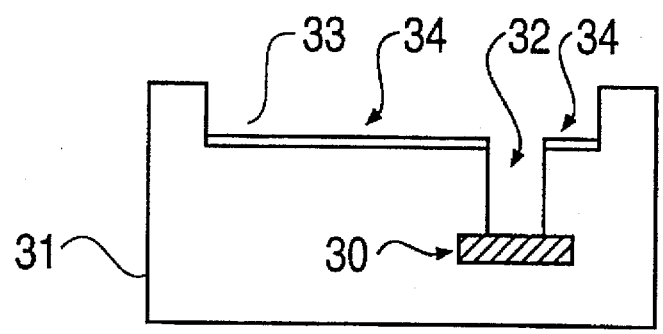
FIGS. 6a–c illustrate an exemplary embodiment of the method of the present invention to via hole filling.
Figure 6B:
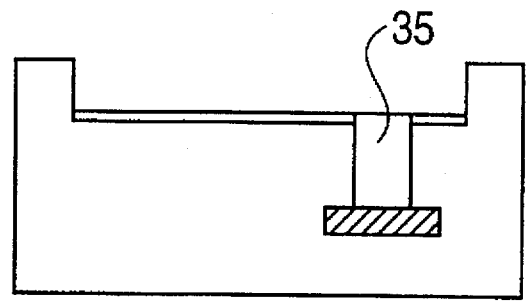
Figure 6C:
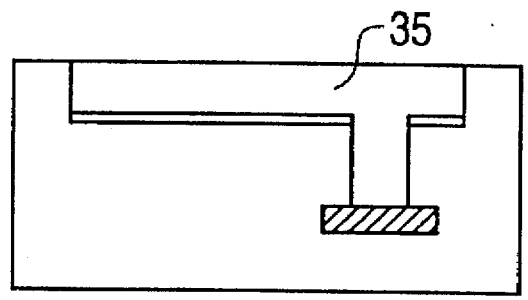

Referring to FIGS. 6a–c, an application of the afore-described process to via hole filling is described. An interconnect 30 (e.g., W) is formed in a dielectric layer 31. A via hole 32 is etched in the dielectric layer 31 to expose the interconnect 30 and an interconnect groove 33 is etched as well. An adhesion layer 34 of TiN, for example, is selectively deposited on a surface exposed by the interconnect groove 33 leaving the structure shown in FIG. 6a. The adhesion layer 34 is a different material than the interconnect 30.

Next, a conductive material 35 such as tungsten is selectively deposited on the interconnect 30 and the adhesion layer 34. The conductive material 35 grows in the interconnect 30 first filling the via hole 32 as depicted in FIG. 6b. After the deposition conditions change and the temperature rises, the conductive material 35 grows on the adhesion layer 34 leaving the structure shown in FIG. 6c.

While particular embodiments of the present invention have been described and illustrated, it should be understood that the invention is not limited thereto since modifications may be made by persons skilled in the art. The present application contemplates any and all modifications that fall within the spirit and scope of the underlying invention disclosed and claimed herein.

What is claimed is:

1. An interconnection structure for a semiconductor device comprising:
   a substrate;
   a dielectric layer formed on said substrate;
   a first opening portion formed in said dielectric layer exposing a first surface on a first level;
   a second opening portion formed in said dielectric layer exposing a second surface on a second level different from the first level, said second opening portion communicating with said first opening portion;
   a first layer of a first material formed on said first surface;
   a second layer of a second material formed on said second surface, said second material being different from said first material; and
   a conductive layer formed on said first layer and said second layer, said conductive layer filling said first and second opening portions and said conductive layer being in direct contact with said first layer on said first surface and with said second layer on said second surface.

2. The interconnection structure according to claim 1 wherein an incubation time for growth of said conductive layer on said second layer exceeds an incubation time for growth of said conductive layer on said first layer.

3. The interconnection structure according to claim 1 wherein said first layer is selected from the group consisting of salicides, silicides, silicon, and metals.

4. The interconnection structure according to claim 3 wherein said second layer is selected from the group consisting of metal nitrides, metal borides, and metals.

5. The interconnection structure according to claim 1 wherein said second layer is titanium nitride.

6. The interconnection structure according to claim 1, wherein an incubation time for growth of said conductive layer on said first and second layers depends on physical characteristics of said first and second layers.

7. An interconnection structure for a semiconductor device comprising:
   a substrate;
   a dielectric layer formed on said substrate;
   a first opening portion formed in said dielectric layer exposing a surface of said substrate;
   a second opening portion formed in said dielectric layer, exposing a surface of said dielectric layer, said second opening portion communicating with said first opening portion;
   a first layer of a first material formed on said surface of said substrate;
   a second layer of a second material formed on said surface of said dielectric layer, said second material being different from said first material; and
   a conductive layer formed on said first layer and said second layer said conductive layer filling said first and second opening portions and said conductive layer being in direct contact with said first layer on said first surface and with said second layer on said second surface.

8. The interconnection structure according to claim 7, wherein said first layer is formed substantially evenly across a bottom surface of said first opening portion including two said surface of said substrate, a side wall of said first opening portion sections, a bottom section contacting said first layer on the bottom surface of said first opening portion and a top section not having said first layer formed thereon.

9. The interconnection structure according to claim 7, wherein an incubation time for growth of said conductive layer on said first layer is shorter than an incubation time for growth of said conductive layer on said second layer.

10. An interconnection structure for a semiconductor device comprising:
    a substrate;
    a gate electrode insulated from said substrate;
    source and drain regions formed in said substrate;
    first layers of a first material formed on said gate electrode and said source and drain regions;
    a dielectric layer formed on said gate electrode and said source and drain regions;
    first opening portions formed in said dielectric layer exposing said first layers;
    a second opening portion formed in said dielectric layer exposing a surface of said dielectric layer, said second opening portion communicating with said first opening portions;
    a second layer of a second material formed on said surface of said dielectric layer, said second material being different from said first material; and a conductive layer formed on said first layers and said second layer, said conductive layer filling said first opening portions and said second opening portion and said conductive layer being in direct contact with said first layers on said first surface and with said second layer on said second surface.

11. The interconnection structure according to claim 10, wherein an incubation time for growth of said conductive layer on said first layers is shorter than an incubation time for growth of said conductive layer on said second layer.

12. An interconnection structure for a semiconductor device comprising:

a substrate;

a dielectric layer formed on said substrate;

a first opening portion formed in said dielectric layer exposing a surface of said substrate;

a second opening portion formed in said dielectric layer, exposing a surface of said dielectric layer, said second opening portion communicating with said first opening portion;

a first layer of a first material formed on said surface of said substrate;

a second layer of a second material formed on said surface of said dielectric layer, said second material being different from said first material; and a conductive layer formed on said first layer and said second layer said conductive layer filling said first and second opening portions, wherein said first layer is formed substantially evenly across a bottom surface of said first opening portion on said surface of said substrate, a side wall of said first opening portion including two sections, a bottom section contacting said first layer on the bottom surface of said first opening portion and a top section not having said first layer formed thereon.

13. An interconnection structure for a semiconductor device comprising:

a substrate;

a dielectric layer formed on said substrate;

a first opening portion formed in said dielectric layer exposing a first surface on a first level;

a second opening portion formed in said dielectric layer exposing a second surface on a second level different from the first level, said second opening portion communicating with said first opening portion;

a first layer of a first material formed on said first surface;

a second layer of a second material formed on said second surface and not in contact with said first layer, said second material being different from said first material; and a conductive layer formed on said first layer and said second layer, said conductive layer filling said first and second opening portions.

14. The interconnection structure according to claim 13, wherein an incubation time for growth of said conductive layer on said first layer is shorter than an incubation time for growth of said conductive layer on said second layer.

* * * * *